United States Patent
Murakami et al.

(10) Patent No.: US 8,811,463 B2
(45) Date of Patent: Aug. 19, 2014

(54) JITTER MEASURING TRIGGER GENERATOR, JITTER MEASURING APPARATUS USING THE SAME, METHOD OF GENERATING JITTER MEASURING TRIGGER, AND METHOD OF MEASURING JITTER

(71) Applicant: Anritsu Corporation, Kanagawa (JP)

(72) Inventors: Takashi Murakami, Kanagawa (JP); Hisashi Matsumoto, Kanagawa (JP)

(73) Assignee: Anritsu Corporation, Atsugi-Shi (JP)

( * ) Notice: Subject to any disclaimer, the term of this patent is extended or adjusted under 35 U.S.C. 154(b) by 0 days.

(21) Appl. No.: 13/752,872

(22) Filed: Jan. 29, 2013

(65) Prior Publication Data
US 2013/0200923 A1    Aug. 8, 2013

(30) Foreign Application Priority Data

Feb. 2, 2012    (JP) .................. 2012-020978

(51) Int. Cl.
*H04B 3/46* (2006.01)
*H04B 17/00* (2006.01)
*H04Q 1/20* (2006.01)
*G01R 31/317* (2006.01)
*H03B 19/00* (2006.01)
*G01R 29/02* (2006.01)

(52) U.S. Cl.
CPC .......... *G01R 29/02* (2013.01); *G01R 31/31709* (2013.01); *H03B 19/00* (2013.01)
USPC .......................................... 375/226; 375/371

(58) Field of Classification Search
USPC .................................. 375/226, 371
See application file for complete search history.

(56) References Cited

U.S. PATENT DOCUMENTS

| 5,245,630 A | * | 9/1993 | Ainsworth | 375/229 |
| 2003/0215037 A1 | * | 11/2003 | Chao et al. | 375/371 |
| 2006/0069967 A1 | * | 3/2006 | Almy et al. | 714/724 |

FOREIGN PATENT DOCUMENTS

JP    05-144582    6/1993

* cited by examiner

*Primary Examiner* — Shuwang Liu
*Assistant Examiner* — Nader Bolourchi
(74) *Attorney, Agent, or Firm* — Pearne & Gordon LLP

(57) ABSTRACT

A phase adjuster 2*a* receives a trigger clock synchronized with a data signal to be measured as input, and controls the phase of the trigger clock such that the trigger period of samples of the data signal to be measured becomes one sample per bit. An adjustable frequency divider 2*b* has a frequency division ratio which is set such that a trigger pulse is generated at the fixed timing of the waveform pattern of the data signal to be measured. An interleaving unit 4*d* uses a discrete value which is in prime relation to the measured pattern length of the data signal to be measured, and acquires data for the number of samples corresponding to the measured pattern length from a sampler 3 by the trigger pulse from the adjustable frequency divider 2*b*.

8 Claims, 4 Drawing Sheets

(a)

• Sampled point

ONE SAMPLE PER BIT : LARGE NUMBER
OF EFFECTIVE JITTER SAMPLES (b)

• Sampled point

MULTIPLE SAMPLES PER BIT : SMALL
NUMBER OF EFFECTIVE JITTER SAMPLES (a)

| No | Phase Shift [UI] | Relative Bit Index |
|---|---|---|
| 0 | 0 | 0 |
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| ... | | |
| 32766 | 32766 | 32766 |
| 32767 | 32767 | 0 |

(b)

| No | Phase Shift [UI] | Relative Bit Inox |
|---|---|---|
| 0 | 0 | 0 |
| 1 | 1 | 4932 |
| 2 | 2 | 9864 |
| 3 | 3 | 14796 |
| 4 | 4 | 19728 |
| 5 | 5 | 24660 |
| 6 | 6 | 29592 |
| 7 | 7 | 1757 |
| 8 | 8 | 6689 |
| 9 | 9 | 11621 |
| ... | | |
| 32766 | 32766 | 27835 |
| 32767 | 32767 | 0 |

(c)

| No | Phase Shift [UI] | Relative Bit Inox |
|---|---|---|
| 0 | 0 | 0 |
| 1 | 0.25 | 0.25 |
| 2 | 0.5 | 0.5 |
| 3 | 0.75 | 0.75 |
| 4 | 1 | 1 |
| 5 | 1.25 | 1.25 |
| 6 | 1.5 | 1.5 |
| 7 | 1.75 | 1.75 |
| 8 | 2 | 2 |
| 9 | 2.25 | 2.25 |
| ... | | |
| 32766 | 8191.5 | 8191.5 |
| 32767 | 8191.75 | 8191.75 |

DATA SIGNAL TO BE MEASURED : 10Gbit/s
MEASURED PATTERN LENGTH : 32767bit
FREQUENCY DIVISION RATIO OF TRIGGER CLOCK : 64

SAMPLING SPEED
(a), (c): 4.768kHZ
(b): 96.869kHz

FIG. 4

JITTER MEASURING TRIGGER GENERATOR, JITTER MEASURING APPARATUS USING THE SAME, METHOD OF GENERATING JITTER MEASURING TRIGGER, AND METHOD OF MEASURING JITTER

TECHNICAL FIELD

The present invention relates to a jitter measuring trigger generator which generates a trigger pulse for measuring a fluctuation (jitter) in the phase of a data signal to be measured, a jitter measuring apparatus using the same, a method of generating a jitter measuring trigger, and a method of measuring a jitter.

BACKGROUND ART

In a data transmission system, if a fluctuation in the phase of a data signal to be transmitted, called a jitter, increases, the data signal may not be normally transferred. For this reason, it is necessary to measure the jitter characteristic of the data transmission system or equipment constructing the system in advance. In particular, in recent years, with higher-speed digital communication, many standards which define a jitter have been made as signal quality evaluation items.

A jitter means a fluctuation in the signal transition timing. A total jitter (TJ) representing a cumulative amount for one minute is divided broadly into a bounded deterministic jitter (DJ) in which a jitter occurrence range is determined and an unbounded random jitter (RJ) in which the jitter amount increases as the jitter is accumulated. The deterministic jitter is further classified into a periodic jitter (PJ), a data dependent jitter (DDJ), and a duty cycle jitter (DCD).

On the other hand, even when the data signal in the data transmission system has a voltage sufficient to identify Mark "1"/Space "0" communication errors may occur due to the occurrence of the jitter. In analyzing the cause for the occurrence of the jitter, there is a significant advantage in analysis by separating the jitter by feature (included in the standard). When measuring the jitters of two DUTs (Devices Under Test) to be measured only for a specific time, even if both jitter values are the same, the jitter value when the measurement time is extended differs between both DUTs due to a difference in the magnitude of randomness between the jitter values. For this reason, in the standard, such as Fiber-Channel, the jitters are classified and defined, and the measurement is defined.

On the other hand, as a method of measuring the jitter of the data signal in the data transmission system, there is a method in which a data signal is input to a waveform observing apparatus, the eye pattern of the data signal is displayed, and the jitter amount of the data signal is recognized from the width of an intersection portion of the rise and the fall of the displayed eye pattern. Patent Document 1 discloses a method which observes an eye pattern of a data signal to obtain a jitter.

However, in the method which measures the jitter on the basis of the width of the eye pattern displayed on the waveform observing apparatus, it is not possible to recognize a data dependent jitter (DDJ) which occurs depending on the pattern of the data signal.

In measuring the jitter of the data signal, while there are various measuring instruments which capture the timing of the data signal, currently when the jitter value has become more generally defined, jitter measurement using a sampling oscilloscope becomes mainstream. For this reason, the manufacturers of various measuring instruments realize a jitter measurement function as an additional function of an existing sampling oscilloscope, and contribute to jitter measurement.

In the method using this type of sampling oscilloscope, predictive calculation is performed from the waveform acquired based on waveform observation to realize jitter measurement. For this reason, it is very important to acquire data more quickly and efficiently.

RELATED ART DOCUMENT

Patent Document

[Patent Document 1] JP-A-5-145582

SUMMARY OF THE INVENTION

Problem that the Invention is to Solve

On the other hand, in the jitter measurement, a necessary sample is data of the data signal only during transition. However, since a sampling oscilloscope of the related art is an instrument which basically observes the waveform in a broad band, the phase shift amount is set to be smaller than one UI (unit interval), a plurality of sample points are acquired to draw the waveform, and data of the data signal other than during transition is also sampled. For this reason, since data unnecessary for jitter measurement is acquired as a sample, there is a problem in that it is not possible to efficiently acquire jitter data.

When measuring a data dependent jitter (hereinafter, referred to as DDJ) which is a type of jitter classified as described above and occurs due to distortion of data, it is necessary to measure the DDJ after recognizing the waveform pattern, and in order to measure positional information of the waveform pattern to be measured, the trigger period is synchronized with the data pattern length. For this reason, there is a problem in that, as the pattern length of the pattern of the data signal to be measured is extended, it takes time to obtain data effective for jitter measurement as a sample, and the sampling speed becomes slow.

Accordingly, the invention has been accomplished in consideration of the above-described problems, and an object of the invention is to provide a jitter measuring trigger generator capable of efficiently acquiring jitter data and performing high-speed sampling without being dependent on the pattern length of data to be measured, a jitter measuring apparatus using the same, a method of generating a jitter measuring trigger, and a method of measuring a jitter.

Means for Solving the Problem

In order to achieve the above-described object, a first aspect of the invention provides a jitter measuring trigger generator 2 which generates a trigger pulse for measuring a jitter included in a data signal to be measured. The jitter measuring trigger generator 2 includes a phase adjuster 2a which receives a trigger clock synchronized with the data signal to be measured as input, and controls the phase of the trigger clock such that the trigger period of samples of the data signal to be measured becomes one sample per bit of the data signal to be measured, and an adjustable frequency divider 2b which is able to set a frequency division ratio such that the trigger pulse is generated at the fixed timing of a sample position serving as a point to be sampled in the waveform pattern of the data signal to be measured.

According to a second aspect of the invention, the jitter measuring trigger generator according to the first aspect of the invention may further include an interleaving unit 4d which, by means of a discrete value in prime relation to the measured pattern length of the data signal to be measured, acquires data for the number of samples corresponding to the measured pattern length.

A jitter measuring apparatus according to a third aspect of the invention includes a sampler 3 which samples a data signal to be measured at the timing according to a trigger pulse generated by the jitter measuring trigger generator 2 according to the first or second aspect of the invention, and a data processing unit 4 which processes data sampled by the sampler to separate a jitter value by a transition sample for each jitter component and performs a jitter analysis.

A fourth aspect of the invention provides a method of generating a jitter measuring trigger which generates a trigger pulse for measuring a jitter included in a data signal to be measured. The method includes the steps of receiving a trigger clock synchronized with the data signal to be measured as input, and controlling the phase of the trigger clock such that the trigger period of samples of the data signal to be measured becomes one sample per bit of the data signal to be measured, and setting a frequency division ratio such that the trigger pulse is generated at the fixed timing of a sample position serving as a point to be sampled in the waveform pattern of the data signal to be measured.

According to a fifth aspect of the invention, the method according to the fourth aspect of the invention may further include the step of, by means of a discrete value in prime relation to the measured pattern length of the data signal to be measured, acquiring data for the number of samples corresponding to the measured pattern length.

A method of measuring a jitter according to a sixth aspect of the invention includes sampling a data signal to be measured at the timing according to a trigger pulse generated by the method of generating a jitter measuring trigger according to the fourth or fifth aspect of the invention, and processing the sampled data to separate a jitter value by a transition sample for each jitter component and performing a jitter analysis.

Advantage of the Invention

According to the aspects of the invention, it is possible to eliminate non-transition data unnecessary for jitter measurement in a data signal to be measured as much as possible and to efficiently acquire jitter data.

Data for the number of samples corresponding to the pattern length number of the pattern of the data signal to be measured is acquired, thereby acquiring data of one period. Even when the pattern length of the pattern of the data signal is long, the frequency division ratio of the adjustable frequency divider can be set arbitrarily to some extent, and improvement in the sampling speed can be improved. Therefore, it is possible to perform high-speed sampling without being dependent on the pattern length of the pattern of the data signal to be measured and to measure a DDJ at high speed, and as a result, it is possible to achieve higher-speed jitter measurement.

BRIEF DESCRIPTION OF THE DRAWINGS

FIG. 1 is a block diagram showing the schematic configuration of a jitter measuring apparatus according to a first embodiment of the invention.

FIG. 2 is a block diagram showing the schematic configuration of a jitter measuring apparatus according to a second embodiment of the invention.

FIG. 3A is an explanatory view of a method of acquiring a sample for jitter measurement in a jitter measuring apparatus according to an embodiment of the invention. FIG. 3B is an explanatory view of a method of acquiring a sample for jitter measurement in a jitter measuring apparatus of the related art.

[FIGS. 4A to 4C] FIG. 4A is a diagram showing a specific numerical value example when a jitter analysis is performed using the jitter measuring apparatus according to the first embodiment of the invention. FIG. 4B is a diagram showing a specific numerical value example when a jitter analysis is performed using the jitter measuring apparatus according to the second embodiment of the invention. FIG. 4C is a diagram showing a specific numerical value when a jitter analysis is performed by a sampling method using a jitter measuring apparatus of the related art.

MODE FOR CARRYING OUT THE INVENTION

Hereinafter, an embodiment of the invention will be described in detail with reference to the accompanying drawings. The embodiment is not intended to limit the invention, and all other embodiments, examples, operation techniques, and the like based on the embodiment made by those skilled in the art fall within the scope of the invention.

Figure 1:
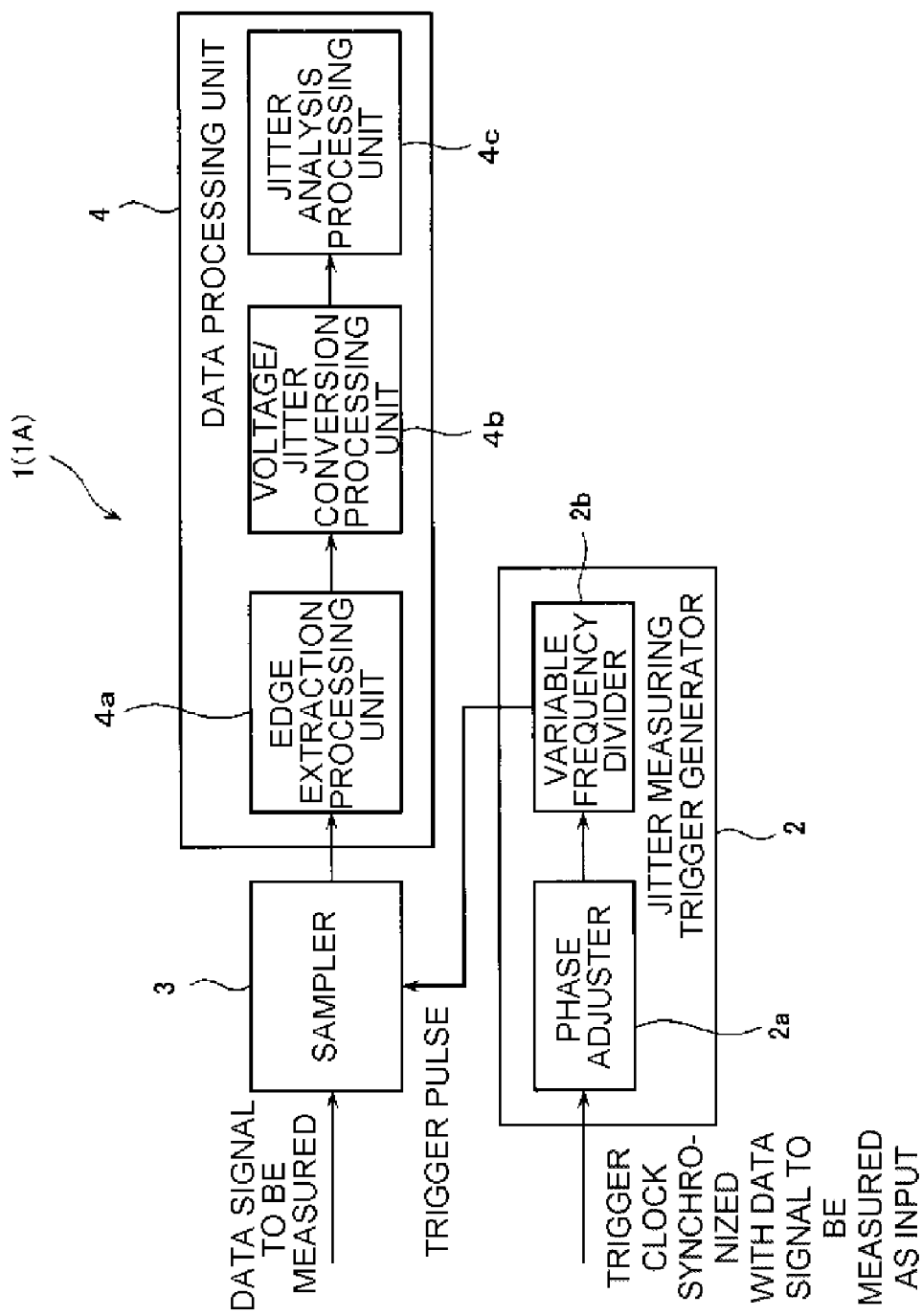
[FIG. 1]
Figure 2:
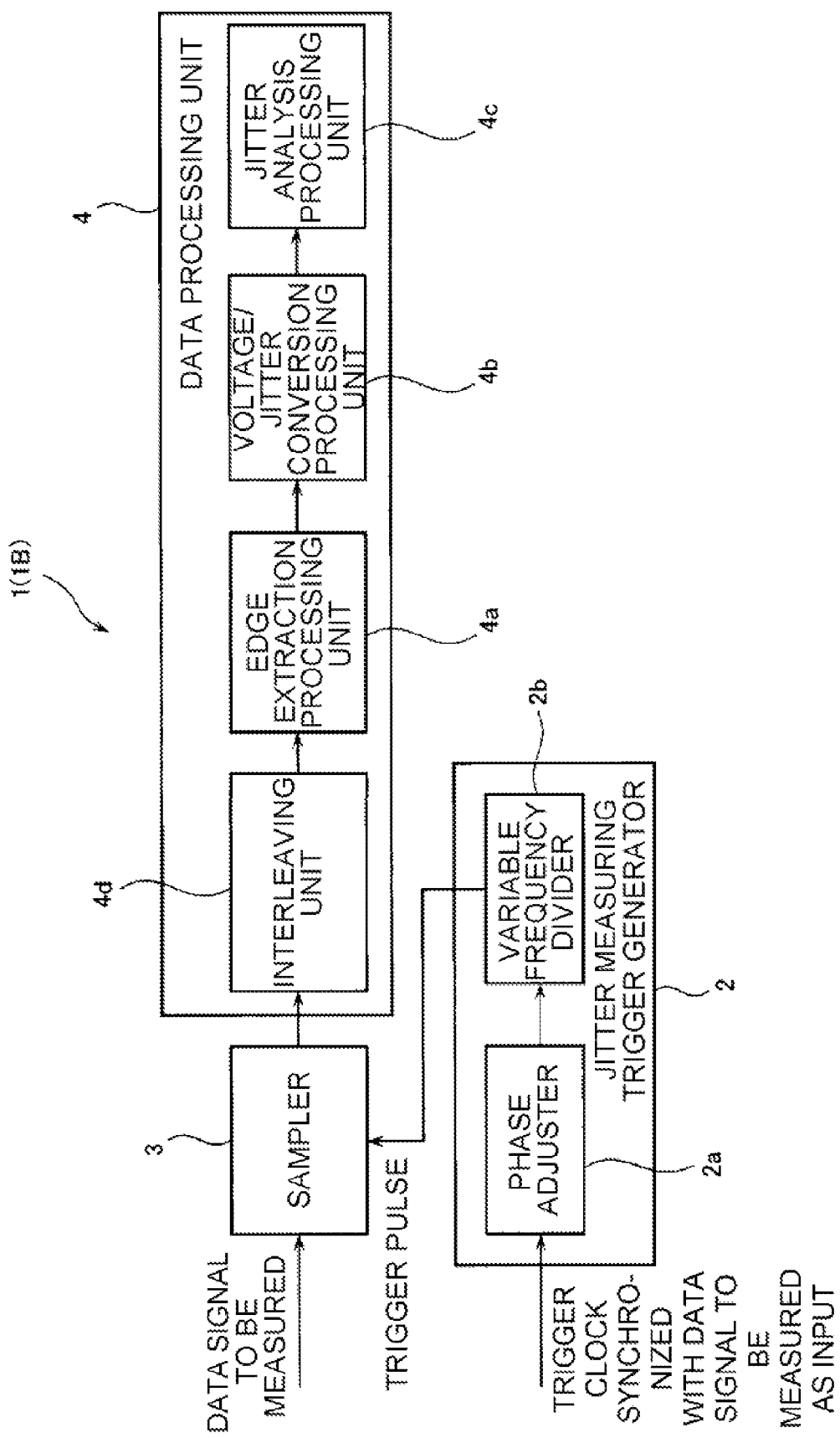
[FIG. 2]
Figure 3:
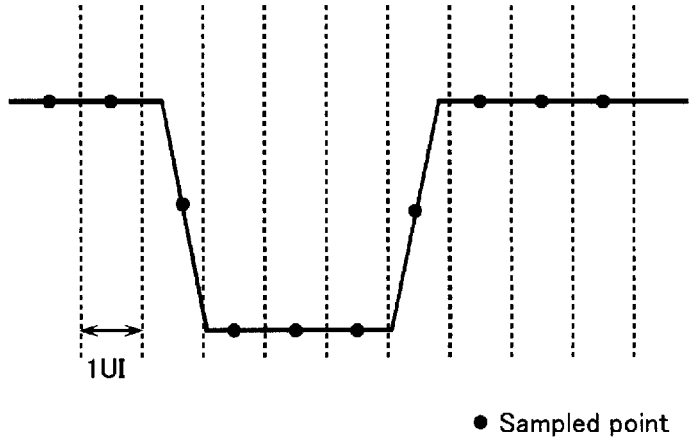
[FIGS. 3A and 3B]
Figure 3:
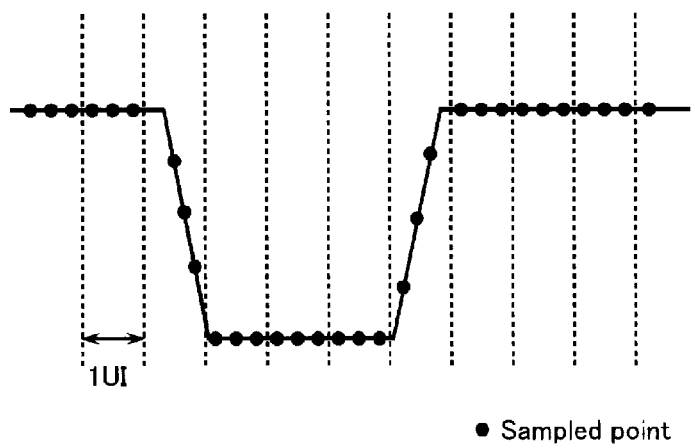

FIG. 1 is a block diagram showing the schematic configuration of a jitter measuring apparatus according to a first embodiment of the invention. FIG. 2 is a block diagram showing the schematic configuration of a jitter measuring apparatus according to a second embodiment of the invention. FIG. 3A is an explanatory view of a method of acquiring a sample for jitter measurement in a jitter measuring apparatus according to an embodiment of the invention. FIG. 3B is an explanatory view of a method of acquiring a sample for jitter measurement in a jitter measuring apparatus of the related art. FIG. 4A is a diagram showing a specific numerical value example when jitter analysis is performed using the jitter measuring apparatus according to the first embodiment of the invention. FIG. 4B is a diagram showing a specific numerical value example when jitter analysis is performed using the jitter measuring apparatus according to the second embodiment of the invention. FIG. 4C is a diagram showing a specific numerical value when jitter analysis is performed by a sampling method using a jitter measuring apparatus of the related art.

As shown in FIG. 1, a jitter measuring apparatus 1 (1A) of the first embodiment schematically includes a jitter measuring trigger generator 2, a sampler 3, and a data processing unit 4.

A jitter measuring trigger generator 2 generates a trigger pulse when sampling a data signal to be measured subjected to jitter measurement using a sampler 3. The jitter measuring trigger generator 2 includes a phase adjuster 2a and an adjustable frequency divider 2b.

The phase adjuster 2a controls the phase of a trigger clock synchronized with the data signal to be measured, and is constituted by an instrument which is able to adjust the output timing of the trigger clock. In the phase adjuster 2a, the trigger clock synchronized with the data signal to be measured is received as input, the phase of the trigger clock is controlled such that the trigger period (the sampling result of the sampler 3) of the sample of the data signal to be measured becomes one sample per bit, and the trigger pulse with the controlled phase is input to the adjustable frequency divider 2b.

The adjustable frequency divider 2b is constituted by a frequency divider in which a frequency division ratio can be set such that the trigger pulse is generated at the fixed timing of the waveform pattern of the data signal to be measured and input to the sampler 3. The adjustable frequency divider 2b frequency-divides the trigger pulse from the phase adjuster 2a at the set frequency division ratio and inputs the divided trigger pulse to the sampler 3. Accordingly, when sampling the data signal to be measured at the timing according to the trigger pulse using the sampler 3, the point to be sampled becomes the fixed timing.

In this way, in the jitter measuring trigger generator 2, a sample position (a point to be sampled) can be defined as the fixed timing by the setting of the frequency division ratio of the adjustable frequency divider 2b, and the sample position can be freely operated under the control of the phase adjuster 2a.

The jitter measuring trigger generator 2 of FIG. 1 may have a configuration in which the phase adjuster 2a and the adjustable frequency divider 2b are connected in series in this order from the input side, or may have a configuration in which the order is reversed.

In this case, the following consideration may be given. For example, in the case of PRBS7 (the pattern length is 127 bits), the setting of the frequency division ratio of the adjustable frequency divider becomes 127. In this case, since sampling is performed once every 127 bits, only a specific bit continues to be sampled. If a phase adjuster having a phase variable range of one UI is used, since sampling continues to be fixed to a specific bit using the adjustable frequency divider, the phase change amount is set to 1 UI, and the sampling timing is swept by 1 UI. As a result, the results of 127 times of sampling show that one sample is acquired for the pattern of the whole of 127 bits, thereby realizing one sample per bit.

The sampler 3 receives the data signal to be measured subjected to jitter measurement as input, and also receives the trigger pulse generated by the jitter measuring trigger generator 2 as input. The sampler 3 samples the data signal to be measured at the timing according to the trigger pulse.

The data processing unit 4 processes data sampled by the sampler 3 to separate a jitter value by a transition sample for each jitter component and performs a jitter analysis. The data processing unit 4 includes an edge extraction processing unit 4a, a voltage/jitter conversion processing unit 4b, and a jitter analysis processing unit 4c. The data processing unit 4 stores the transition shape of the waveform of the data signal to be measured having been measured in advance.

The edge extraction processing unit 4a performs processing for separating a transition sample effective as jitter data and a non-transition sample for a data string sampled by the sampler 3 and extracting only the transition sample.

The voltage/jitter conversion processing unit 4b converts sampling data (voltage value) by the transition sample extracted by the edge extraction processing unit 4a to a jitter value (time) through known calculation processing.

The jitter analysis processing unit 4c performs separation calculation on each jitter component on the basis of an effective jitter value from among the jitter values (time) converted by the voltage/jitter conversion processing unit 4b.

In the jitter measuring apparatus 1A of the first embodiment having the above configuration, since waveform drawing is not basically required, as shown in FIG. 3A, the trigger pulse is necessarily generated at the fixed timing of the pattern of the data signal to be measured while controlling the phase of the trigger clock such that the trigger period of the sample of the data signal to be measured becomes one sample per UI (per bit). Accordingly, the sampling result of the data signal to be measured becomes only one sample per bit, and the phase of the trigger pulse is adjusted in the transition time, making it possible to eliminate non-transition data as much as possible. As a result, it is possible to efficiently acquire jitter data compared to the sampling oscilloscope of the related art.

In the sampling oscilloscope of the related art, since waveform drawing is required, for example, as shown in FIG. 3B, the trigger pulse is necessarily generated at the fixed timing of the pattern of the data signal to be measured while controlling the phase of the trigger clock such that the trigger period of the sample of the data signal to be measured becomes multiple samples (in the illustrated example, three samples) per UI (per bit).

On the other hand, as in the jitter measuring apparatus 1A of the first embodiment, even if the trigger period of the sample of the data signal to be measured is one sample per UI (per bit), when measuring a DDJ, it is necessary to estimate a pattern position. For this reason, it is necessary to locate the trigger pulse at a fixed position, and the setting of the frequency division ratio of the adjustable frequency divider 2b becomes equal to the setting during waveform observation of the sampling oscilloscope of the related art. Accordingly, it is not possible to prevent a decrease in the sampling speed during long period pattern measurement.

To be explicit, during the normal waveform observation using the sampling oscilloscope of the related art, the positions of the bits to be accumulated are in a fixed order of 1→2→3→ . . . . If the positions of the bits are in a fixed order, as in the jitter measuring apparatus 1A of the first embodiment, since the pattern position can be simply operated by the phase adjuster 2a, it is possible to easily measure a DDJ.

However, in the jitter measuring apparatus 1A of the first embodiment, in order to make the positions of the bits be in a fixed order, it is necessary to set such that the trigger pulse becomes one degree per multiple patterns with the setting of the frequency division ratio of the adjustable frequency divider 2b. For this reason, if the data signal to be measured becomes a long period pattern, measurement takes time. For example, while PRBS15 which is generally used in communication has one period of 32767 bits, in the sampling oscilloscope of the related art, measurement in one period requires about 7 s. As shown in the example of FIG. 4C, this is because the frequency division ratio of the adjustable frequency divider increases to 32767, and the sampling speed is limited to being roughly about 4.7 kHz.

Accordingly, in a jitter measuring apparatus 1 (1B) according to a second embodiment of the invention described below, the above-described problem is solved through interleaving.

As shown in FIG. 2, a jitter measuring apparatus 1B of the second embodiment has a configuration in which an interleaving unit 4d is added to the data processing unit in the configuration (the jitter measuring trigger generator 2, the sampler 3, and the data processing unit 4) of the jitter measuring apparatus 1A of the first embodiment. The same constituent elements as those in the jitter measuring apparatus 1A of the first embodiment are represented by the same reference numerals, and description thereof will not be repeated.

The interleaving unit 4d is provided between the sampler 3 and the edge extraction processing unit 4a. The interleaving unit 4d interleaves and combines the transition sample obtained through sampling in the sampler 3, and reproduces the input bit pattern.

To be explicit, in order to solve the problem when data is acquired with the positions of the bits in a fixed order, the interleaving unit 4d acquires data discretely.

Specifically, as shown in the example of FIG. 4B, the interleaving unit 4b acquires data from the sampler 3 in a bit order of 1→4932→9864→14796→ . . . . At this time, a discrete value is in prime relation to the measured pattern length of the data signal to be measured. The interleaving unit 4d acquires data for the number of samples corresponding to the measured pattern length from the sampler 3, thereby acquiring the whole of data in one period. Since the trigger period of the sample of the data signal to be measured is one sample per UI (per bit), thereafter, it becomes possible to restore data from the discrete value through interleaving.

In this way, in the jitter measuring apparatus 1B of the second embodiment, since the discrete value is used, even when the measured pattern length of the data signal to be measured is long, it becomes possible to set the value of the frequency division ratio of the adjustable frequency divider 2b arbitrarily to some extent. As a result, the sampling speed is not limited. In the jitter measuring apparatus 1B of the second embodiment, as shown in FIG. 4B, the sampling speed becomes 96.869 kHz, and jitter measurement can be performed at a speed about 20 times higher than the sampling oscilloscope of the related art shown in FIG. 4C or the jitter measuring apparatus 1A of the first embodiment shown in FIG. 4A.

FIGS. 4A to 4C show a specific numerical value example when, in a data signal to be measured of 10 Gbit/s, the measured pattern length is 32767 bits and the frequency division ratio of the trigger clock to be input is 64.

While data sampled by the sampler 3 is obtained as a voltage value, the transition shape of the waveform of the data signal to be measured is stored in the data processing unit 4 in advance, and a voltage in the voltage/jitter conversion processing unit 4b can be mutually converted to a jitter value. Since the time occupied by mutual conversion is not dominant, there is no effect on an increase in speed.

As described above, in the jitter measuring apparatus 1 (1A, 1B) according to the embodiment of the invention, since one UI is set to one bit as the adjustable phase shift amount, and data of the data signal to be measured has only one sample per bit, one period can be expressed with the samples of data corresponding to the pattern length number of the data signal to be measured. That is, data for the number of samples corresponding to the pattern length number of the data signal to be measured is acquired, thereby acquiring the whole of data of the data signal to be measured in one period. Therefore, it is possible to eliminate non-transition data unnecessary for measurement in the data signal to be measured and to efficiently acquire jitter data.

In the sampling method using the sampling oscilloscope of the related art, as shown in FIG. 3B or 4C, data of a data signal to be measured has samples of multiple pieces of data per bit. For this reason, one period may not be expressed with the samples corresponding to the pattern length number of the waveform pattern of the data signal to be measured.

In particular, in the jitter measuring apparatus 1B according to the second embodiment of the invention, since the discrete value is used for data acquisition, even when the pattern length of the data signal to be measured is long, the value of the frequency division ratio of the adjustable frequency divider 2b can be set arbitrarily to some extent, the sampling speed is not limited, and high-speed sampling can be performed without being dependent on the pattern length of the data signal to be measured, thereby achieving improvement in the sampling speed. Therefore, it is possible to measure a DDJ at high speed, and as a result, it is possible to achieve higher-speed jitter measurement.

Specifically, as shown in FIGS. 4A to 4C, when the upper limit value of the sampling speed is 100 kHz, and the data signal to be measured (measured pattern length: 32767 bits) of 10 Gbit/s is sampled, in the sampling oscilloscope of the related art or the jitter measuring apparatus 1A of the first embodiment, the sampling speed becomes 4.768 kHz. In contrast, in the jitter measuring apparatus 1B of the second embodiment, the sampling speed becomes 96.869 kHz.

Therefore, in the jitter measuring apparatus 1B of the second embodiment, it becomes possible to perform jitter measurement at a sampling speed about 20 times higher than in the sampling oscilloscope of the related art or the jitter measuring apparatus 1A of the first embodiment.

Although in the above-described numerical value example, a case where the upper limit value of the sampling speed of the system is 100 kHz has been described, the jitter measuring apparatus of the second embodiment can set the frequency division ratio of the adjustable frequency divider 2b in accordance with the upper limit value of the sampling speed of the system. For this reason, if the upper limit value of the sampling speed of the system increases, it is thus possible to set the frequency division ratio of the adjustable frequency divider 2b to be small, and to achieve further improvement in the sampling speed.

DESCRIPTION OF REFERENCE NUMERALS AND SIGNS (1A, 1B): jitter measuring apparatus
2: jitter measuring trigger generator
2a: phase adjuster
2b: adjustable frequency divider
3: sampler
4: data processing unit
4a: edge extraction processing unit
4b: voltage/jitter conversion processing unit
4c: jitter analysis processing unit
4d: interleaving unit

The invention claimed is:

1. A jitter measuring trigger generator which generates a trigger pulse for measuring a jitter included in a data signal to be measured, the jitter measuring trigger generator comprising:
   a phase adjuster which receives as an input a trigger clock synchronized with the data signal to be measured, and controls a phase of the trigger clock such that the trigger period of a high-speed sampling of the data signal to be measured becomes only one sample per bit of the data signal to be measured, thereby one sample is acquired for each bit of the data signal to be measured; and
   an adjustable frequency divider which is able to set a frequency division ratio such that the trigger pulse is generated at the fixed timing of a sample position serving as a point to be sampled in the waveform pattern of the data signal to be measured, wherein
   the jitter measuring trigger generator performs the high-speed sampling without being dependent on a length of the data signal to be measured.

2. The jitter measuring trigger generator according to claim 1, further comprising:
   an interleaving unit which, by means of a discrete value in prime relation to a measured length of the data signal to be measured, acquires data for a number of samples corresponding to the measured length.

3. A jitter measuring apparatus comprising:
   a sampler which samples the data signal to be measured at a timing according to a trigger pulse generated by the jitter measuring trigger generator according to claim 1; and
   a data processing unit which processes the data signal to be measured sampled by the sampler to separate a jitter value by a transition sample for each jitter component and performs a jitter analysis.

4. A jitter measuring apparatus comprising:
a sampler which samples the data signal to be measured at a timing according to a trigger pulse generated by the jitter measuring trigger generator according to claim 2; and
a data processing unit which processes data sampled by the sampler to separate a jitter value by a transition sample for each jitter component and performs a jitter analysis.

5. A method of generating a jitter measuring trigger which generates a trigger pulse for measuring a jitter included in a data signal to be measured, the method comprising the steps of:
receiving as an input a trigger clock synchronized with the data signal to be measured, and controlling a phase of the trigger clock such that the trigger period of a high-speed sampling of the data signal to be measured becomes only one sample per bit of the data signal to be measured, thereby one sample is acquired for each bit of the data signal to be measured; and
setting a frequency division ratio such that the trigger pulse is generated at the fixed timing of a sample position serving as a point to be sampled in the waveform pattern of the data signal to be measured, wherein the method of generating a jitter measuring trigger performs the high-speed sampling without being dependent on a length of the data signal to be measured.

6. The method according to claim 5, further comprising the step of:
by means of a discrete value in prime relation to a measured length of the data signal to be measured, acquiring data for a number of samples corresponding to the measured length.

7. A method of measuring a jitter, the method comprising the steps of:
sampling the data signal to be measured at a timing according to a trigger pulse generated by the method of generating a jitter measuring trigger according to claim 5; and
processing the data signal to be measured sampled to separate a jitter value by a transition sample for each jitter component and performing a jitter analysis.

8. A method of measuring a jitter, the method comprising the steps of:
sampling the data signal to be measured at the timing according to a trigger pulse generated by the method of generating a jitter measuring trigger according to claim 6; and
processing the sampled data to separate a jitter value by a transition sample for each jitter component and performing a jitter analysis.

* * * * *